US012727094B2

(12) United States Patent
Basti et al.

(10) Patent No.: US 12,727,094 B2
(45) Date of Patent: Sep. 1, 2026

(54) REMOTE CONTROL WITH ONE-PIECE CASING AND CHASSIS

(71) Applicant: Crestron Electronics, Inc., Rockleigh, NJ (US)

(72) Inventors: Gautham Basti, Bengaluru (IN); Daniel Previti, Tappan, NY (US)

(73) Assignee: Crestron Electronics, Inc., Rockleigh, NJ (US)

(*) Notice: Subject to any disclaimer, the term of this patent is extended or adjusted under 35 U.S.C. 154(b) by 68 days.

(21) Appl. No.: 19/017,852

(22) Filed: Jan. 13, 2025

(65) Prior Publication Data

US 2025/0151209 A1 May 8, 2025

Related U.S. Application Data

(63) Continuation of application No. 18/125,293, filed on Mar. 23, 2023, now Pat. No. 12,232,275.

(51) Int. Cl.

*H05K 5/00* (2025.01)
*H05K 5/02* (2006.01)

(52) U.S. Cl.

CPC ......... *H05K 5/0018* (2022.08); *H05K 5/0086* (2013.01); *H05K 5/0217* (2013.01); *H05K 5/0247* (2013.01)

(58) Field of Classification Search

CPC .. H05K 5/0018; H05K 5/0086; H05K 5/0217; H05K 5/0247

USPC ........................................ 361/807, 809, 810

See application file for complete search history.

(56) References Cited

U.S. PATENT DOCUMENTS

D354,059 S 1/1995 Hendricks
5,867,772 A 2/1999 Jonsson et al.
D448,358 S 9/2001 Tickle
D450,662 S 11/2001 Kwok
(Continued)

FOREIGN PATENT DOCUMENTS

CN 303395620 9/2015
CN 303395649 9/2015
(Continued)

OTHER PUBLICATIONS

New Crestron HR-310 Handh Eld Remote I eBay, update 2018, https://www.ebay.com/itm/New-CRESTRON-HR-310-HANDHELD-REMOTE-/302945710706?_trksid=p2385738.m4383.14275.c10, site visited Nov. 27, 2018.

Pan Tech Design Announces Immediate Integration with New Crestron HR-310 Remote, PRweb website post 2018, https://www.prweb.com/releases/2018/01/prweb15089283.htm, site visited Nov. 27, 2018.

(Continued)

*Primary Examiner* — Hung S. Bui

(74) *Attorney, Agent, or Firm* — Crestron Electronics, Inc.

(57) ABSTRACT

A remote control device is disclosed. A single-piece casing has a front surface, rear surface, and pair of opposing side surfaces disposed between the front and rear surfaces. An inner cavity is formed within the casing between the top, bottom and side surfaces and extends along at least part of a length of the casing. A front opening is formed in the front surface and extends into the inner cavity. The front opening is configured to receive a display. At least one key opening is formed in the front surface and extends into the inner cavity. A keypad is configured to be disposed within the inner cavity and includes at least one key positioned on the keypad to extend through the at least one key opening. A chassis has a body configured to be disposed within the inner cavity at least beneath the keypad and the front opening.

17 Claims, 14 Drawing Sheets

(56) References Cited

U.S. PATENT DOCUMENTS

D451,891 S 12/2001 Noonan et al.
D489,361 S 5/2004 Mori
D513,498 S 1/2006 Krzyzanowski
D515,041 S 2/2006 Yun et al.
D515,557 S 2/2006 Okuley
D520,495 S 5/2006 Dukerschein et al.
D521,459 S 5/2006 Yun
D524,298 S 7/2006 Hedderich
D531,137 S 10/2006 Wu
D531,585 S 11/2006 Weitgasser
D531,964 S 11/2006 Peh
D538,788 S 3/2007 Reimann
D543,196 S 5/2007 Krzyzanowski
D544,467 S 6/2007 Tsuge
D548,195 S 8/2007 Poulet
D548,727 S 8/2007 Sagawa et al.
D549,665 S 8/2007 Chen
D550,213 S 9/2007 Hakoda
D552,601 S 10/2007 Oota
D555,107 S 11/2007 Choi et al.
D559,202 S 1/2008 Sim
D559,231 S 1/2008 Krzyzanowski et al.
D565,555 S 4/2008 Goto
D568,298 S 5/2008 Lundgren
D572,203 S 7/2008 Ha
D583,363 S 12/2008 Song et al.
D584,718 S 1/2009 Moller
D587,689 S 3/2009 Hwang et al.
7,515,431 B1 4/2009 Zadesky et al.
D594,850 S 6/2009 Yan
D602,474 S 10/2009 Hansen et al.
D603,843 S 11/2009 Einaudi
D605,634 S 12/2009 Lewis
D607,846 S 1/2010 Daniels
D611,432 S 3/2010 Ducret
D611,456 S 3/2010 Lin
D614,607 S 4/2010 Kamegi
D615,965 S 5/2010 Yokota
7,724,532 B2 * 5/2010 Zadesky ............... H04M 1/026
361/752
D617,747 S 6/2010 Kobes
D618,628 S 6/2010 Giugiaro
D622,703 S 8/2010 Cheng The et al.
D625,693 S 10/2010 Charleux
D626,531 S 11/2010 Farmer et al.
D628,982 S 12/2010 Tellier
D630,188 S 1/2011 Daniels
D631,871 S 2/2011 Demskie et al.
D632,264 S 2/2011 Choi et al.
D639,276 S 6/2011 Loh
D639,278 S 6/2011 Chai et al.
D639,750 S 6/2011 Chouji
D641,734 S 7/2011 Chou et al.
D647,509 S 10/2011 Maier
D648,285 S 11/2011 Kashimoto
D648,327 S 11/2011 Maier
D652,820 S 1/2012 Peh
D653,240 S 1/2012 Wakata
D654,055 S 2/2012 Won
D654,477 S 2/2012 Weitgasser
D654,478 S 2/2012 Noh et al.
D656,487 S 3/2012 Corsini et al.
D656,488 S 3/2012 Nakayama et al.
D657,754 S 4/2012 Kashimoto
D664,947 S 8/2012 Choi et al.
D665,382 S 8/2012 Kim et al.
D670,658 S 11/2012 Iliffe-Moon
D671,529 S 11/2012 Zaliauskas
D673,934 S 1/2013 Shin et al.
D679,266 S 4/2013 Shin et al.
D689,468 S 9/2013 Lim et al.
D692,417 S 10/2013 Tu
D697,055 S 1/2014 McManigal
D697,874 S 1/2014 Stusynski
D703,187 S 4/2014 Maier et al.
D708,589 S 7/2014 Kosuge
D714,740 S 10/2014 Corsini
D722,044 S 2/2015 Daniel
D724,062 S 3/2015 Feldstein et al.
D724,568 S 3/2015 Peh
D726,164 S 4/2015 Feldstein
D735,718 S 8/2015 Pang et al.
D738,883 S 9/2015 Pang et al.
D743,915 S 11/2015 Sakai
D754,105 S 4/2016 Jou et al.
D755,758 S 5/2016 Maier et al.
D760,699 S 7/2016 Peh
D788,743 S 6/2017 Cha et al.
D795,444 S 8/2017 Chen
D809,485 S 2/2018 McManigal et al.
D823,834 S 7/2018 Wang
D825,497 S 8/2018 Mizushi
D847,792 S 5/2019 Wendling et al.
D847,793 S 5/2019 Wendling et al.
D848,977 S 5/2019 Pang et al.
D857,661 S 8/2019 Shigeta et al.
D866,526 S 11/2019 Pinto Couto
D898,704 S 10/2020 Wendling et al.
D898,705 S 10/2020 Wendling et al.
D914,643 S 3/2021 Liu
D923,605 S 6/2021 Corsini
D923,606 S 6/2021 Corsini
D939,452 S 12/2021 Yang
D952,607 S 5/2022 Lee
D958,760 S 7/2022 Baek
D980,192 S 3/2023 Oberholzer
D980,822 S 3/2023 Lin
D997,913 S 9/2023 Zhang
D999,178 S 9/2023 Ling
D1,005,264 S 11/2023 King
D1,005,292 S 11/2023 King
D1,011,313 S 1/2024 Tordjman
D1,049,078 S 10/2024 Previti
2003/0095048 A1 5/2003 Choi et al.
2007/0054651 A1 3/2007 Farmer
2010/0033498 A1 2/2010 Terasaki et al.
2012/0212678 A1 8/2012 Wang

FOREIGN PATENT DOCUMENTS

CN 303816344 8/2016
CN 304280206 9/2017
CN 304530027 3/2018
CN 304530028 3/2018
CN 307549582 9/2022
CN 307887880 3/2023
CN 307887881 3/2023
CN 307887882 3/2023
EM 000531975-0001 7/2006
EM 004015766-0001 6/2017
GB 6287825 6/2023
GB 6302958 8/2023
GB 6307234 9/2023
IL 64833 11/2020
JP D1221066 10/2004
KR 300803807.0000 7/2015

OTHER PUBLICATIONS

"All-New Crestron HR-310 and TSR-310 Handheld Remotes", https://vimeo.com/248330107, posted 2018, screencapture-vimeo-248330107-2023-03-09-15_33_17.pdf.

SofaBaton, SofaBaton U1 Universal Remote with Smartphone APP, dated Jun. 2, 2022, [online], [site visited May 20, 2024]. Available from Internet, URL: https:// https://www.amazon.com/SofaBaton-Universal-Smartphone-Bluetooth-Compatible/dp/BOB312J F4N/ (Year: 2022).

Crestron, All-New Crestron H R-310 and TSR-310 Hand held Residential Remotes, dated Apr. 12, 2018, [online], [site visited May 20, 2024]. Available from Internet, URL: https://www.youtube.com/watch?v=BlhV9U038J8 (Year: 2018).

(56) References Cited

OTHER PUBLICATIONS

Zwink, Adriana, "How to Open the Apple TV 4K 2021 Siri Remote", www.iFixit.com, © iFixit—CC BY-NC-SA, Guide ID: 145221—Draft: Nov. 8, 2021.
One for All Store, "U RC7880 Universal Smart Remote . . . ", available at amazon.com, oldest review date: Feb. 15, 2021, site visited Nov. 13, 2024, available at URL: https://a.co/d/aSFdq3R (Year: 2021).
Amazon Renewed Store, "Logitech 915-000162 . . . ", available at amazon.com, date first available Mar. 25, 2016, site visited Sep. 5, 2024, available at URL: https://a.co/d/bGRnBQC (Year: 2016).
Logitech, "Harmony 950 IR TV Remote Control . . . ", available at amazon.com, date first available Sep. 1, 2016, site visited Sep. 5, 2024, available at URL: https://a.co/d/9e7UV18 (Year: 2016).
Chunghop Store, "Universal IR Learning Remote . . . ", available at amazon.com, date first available Mar. 28, 2018, site visited Sep. 5, 2024, available at URL: https://a.co/d/9N1Adhd (Year: 2018).
Becsy, "Universal Remote Controller . . . ", available at amazon.com, date first available Aug. 13, 2022, site visited Sep. 5, 2024, available at URL: https://a.co/d/2zrkXu3 (Year: 2022).
Vizio, "SmartCaset Universal Remote Control . . . ", available at amazon.com, oldest review date Aug. 26, 2024, site visited Nov. 13, 2024, available at URL: https://a.co/d/5zWWDky (Year: 2024).
Pairtty, "Universal TV Remote . . . ", available at amazon.com, oldest review date: Sep. 20, 2024, site visited Nov. 13, 2024, available at URL: https://a.co/d/9c7mi5M (Year: 2024).
Sofa Baton, "X1 S Universal Remote . . . ", available at amazon.com, oldest review date Aug. 23, 2024, site visited Nov. 13, 2024, available at URL: https://a.co/d/1 BVKj Fk (Year: 2024).

* cited by examiner

106

REMOTE CONTROL WITH ONE-PIECE CASING AND CHASSIS

CROSS-REFERENCE TO RELATED APPLICATIONS

This application is a continuation of U.S. application Ser. No. 18/125,293, filed Mar. 23, 2023, the disclosure of which is incorporated herein by reference.

BACKGROUND OF THE INVENTION

Technical Field

The present embodiments relate to a remote control device and, more particularly, to the construction and assembly of a remote control device.

Background Art

In recent years, handheld remote control devices have become commonplace not only for use in controlling televisions and set top boxes, but also for controlling other systems used in various settings such as home theaters, bedrooms, hotel rooms, boardrooms, and other venues. As the number of uses increases, the complexity of the internal workings of the remote control devices has often likewise increased. This increase in device complexity has often led to increased difficulty in manufacturing and assembling these remote control devices.

Typically, remote control devices are comprised of a housing made of two or more pieces which are brought together in various ways. For example, the pieces of the housing may be snapped or glued together, leading to difficulties should the need later arise to disassemble the remote control device for repair or service. Additionally, during assembly of the remote control device, the various components must be fastened together and placed in one or more of the pieces of the housing, where they must stay in place while the pieces of the housing are brought together and secured. The assembly of the remote control in this manner typically must be carried out by a person of particular skill and experience, often using specialized tools that may be specific to assembling that particular model remote. As a result, the time required to assemble the remote control device and the cost of assembly increases.

It is therefore desirable to provide a remote control device that is more simply constructed and simpler to assemble. It is also desirable to provide a remote control device that is simpler to service after assembly.

SUMMARY OF THE INVENTION

It is to be understood that both the general and detailed descriptions that follow are exemplary and explanatory only and are not restrictive.

Disclosure of Invention

In accordance with an aspect, a remote control device comprises (a) a single-piece casing having formed therein a first opening disposed at one end, a second opening disposed at another end, an inner cavity disposed between the first opening and the second opening, a front opening disposed in a front surface of the casing, and a plurality of key openings disposed in the front surface; (b) a keypad configured to be disposed within the inner cavity, and having a plurality of keys arranged on a surface of the keypad, the plurality of keys being configured to extend through the plurality of key openings; (c) a chassis having a body configured to be inserted into the inner cavity though the first opening and disposed in the inner cavity below the keypad, the chassis having an end part configured to be disposed outside of the casing, an edge of the end part being configured to abut against the one end of the casing; and (d) an end insert having a body configured to be inserted into the inner cavity though the second opening and disposed in the inner cavity below the body of the chassis, the end insert having an end part configured to be located at the another end of the casing.

According to a further aspect, a remote control device comprises (a) a single-piece casing having formed therein a first opening disposed at one end, a second opening disposed at another end, and an inner cavity disposed between the first opening and the second opening; (b) a chassis having a body configured to be inserted into the inner cavity though the first opening and having an end part configured to be disposed outside of the casing, and edge of the end part being configured to abut against the one end of the casing; and (c) an end insert having a body configured to be inserted into the inner cavity though the second opening and having an end part configured to be disposed at the another end of the casing; (d) wherein (1) the body of the chassis includes at least one threaded opening disposed at an end opposite to the end part of the chassis, (2) the end part of the end insert includes at least one opening aligned with the at least one threaded opening of the chassis, whereby (3) upon the body of the chassis and the end insert being inserted into the inner cavity of the casing, a threaded screw inserted into the at least one opening of the end insert and turned into the at least one threaded opening of the chassis secures both the chassis and the end insert against the casing.

According to another aspect, a remote control device comprises (a) a single-piece casing having formed therein a first opening disposed at one end, a second opening disposed at another end, an inner cavity disposed between the first opening and the second opening, a front opening disposed in a front surface of the casing, and a plurality of key openings disposed in the front surface; (b) a keypad configured to be disposed within the inner cavity, and having a plurality of keys arranged on a surface of the keypad, the plurality of keys being configured to extend through the plurality of key openings; (c) a chassis having a body configured to be inserted into the inner cavity though the first opening and disposed in the inner cavity below the keypad, the chassis having an end part configured to be disposed outside of the casing, an edge of the end part being configured to abut against the one end of the casing, wherein (1) the body of the chassis includes a pair of legs extending below from the body of the chassis, the pair of legs being configured to support the body of the chassis within the inner cavity and providing a spacing between at least a portion of the body of the chassis and a bottom surface of the inner cavity of the casing, (2) each leg of the pair of legs includes a surface that conforms to a shape of, and contacts with, at least a portion of a sidewall of the inner cavity of the casing, and (3) the body of the chassis includes at least one threaded opening disposed at an end opposite to the end part of the chassis, (d) an end insert having a body configured to be inserted into the inner cavity though the second opening and disposed in the inner cavity in the spacing below the body of the chassis, the end insert having an end part configured to be located at the another end of the casing, wherein (1) the end part of the end insert includes at least one opening aligned with the at least one threaded opening of the chassis, (2) whereby upon the body of the chassis and the end insert being inserted into the inner cavity of the casing, a threaded screw inserted into the at least one opening of the end insert and turned into the at least one threaded opening of the chassis secures both the chassis and the end insert against the casing; and (e) a display configured to be inserted into the front opening of the casing, wherein the remote control device further includes (1) at least one electrical contact configured to electrically connect circuitry disposed within the body of the chassis to the display, and (2) at least one mounting clamp disposed on a front surface of the body of the chassis and configured to secure the display to the chassis upon insertion of the display into the front opening of the casing.

BRIEF DESCRIPTION OF DRAWINGS

The accompanying figures further illustrate the present embodiments.

The components in the drawings are not necessarily drawn to scale, emphasis instead being placed upon clearly illustrating the principles of the present embodiments. In the drawings, like reference numerals designate corresponding parts throughout the several views.

BRIEF DESCRIPTION OF THE SEVERAL VIEWS OF THE DRAWING

Figure 1:
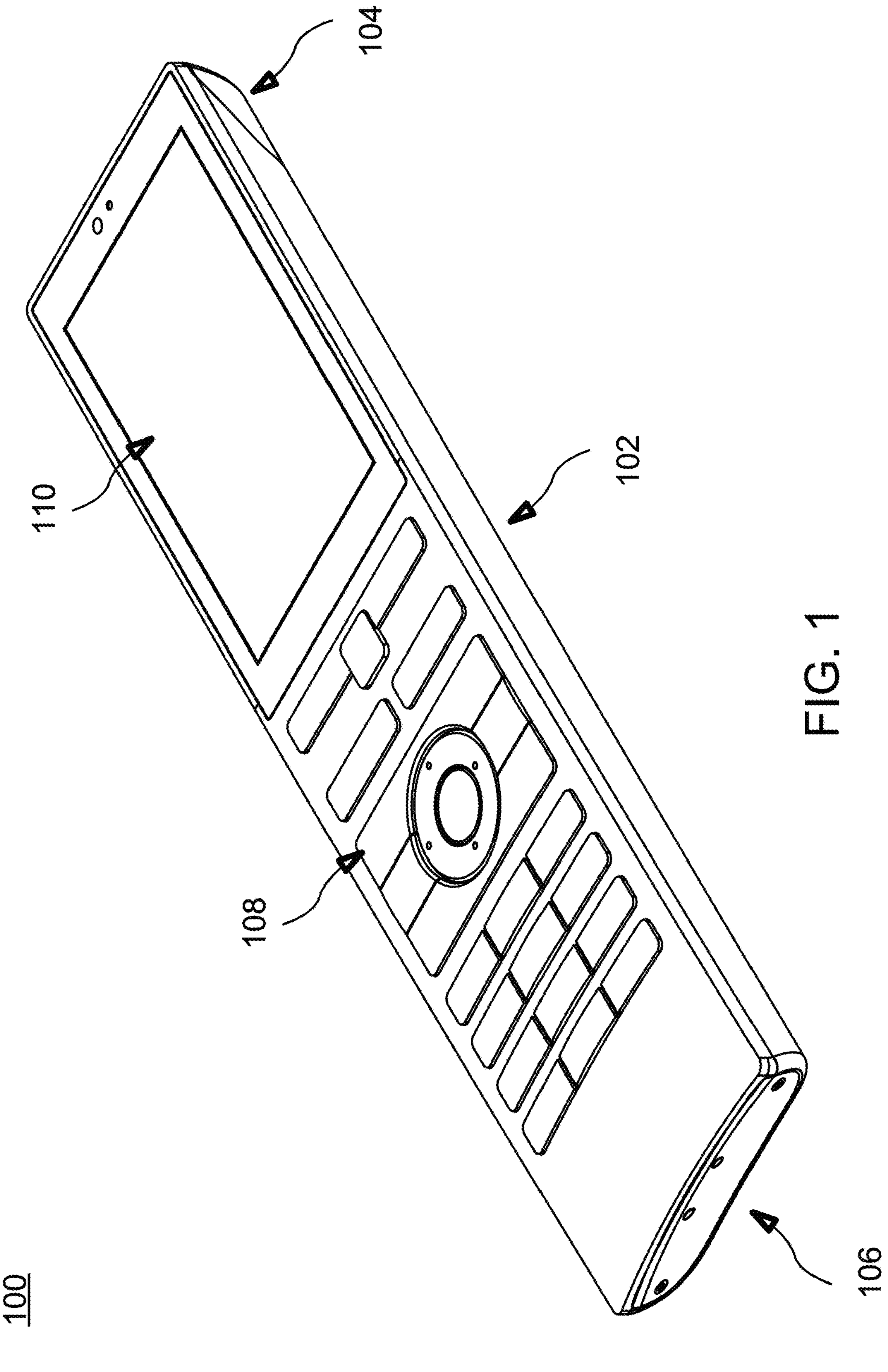

FIG. 1 is a top perspective view of a remote control in accordance with an embodiment.

Figure 2:
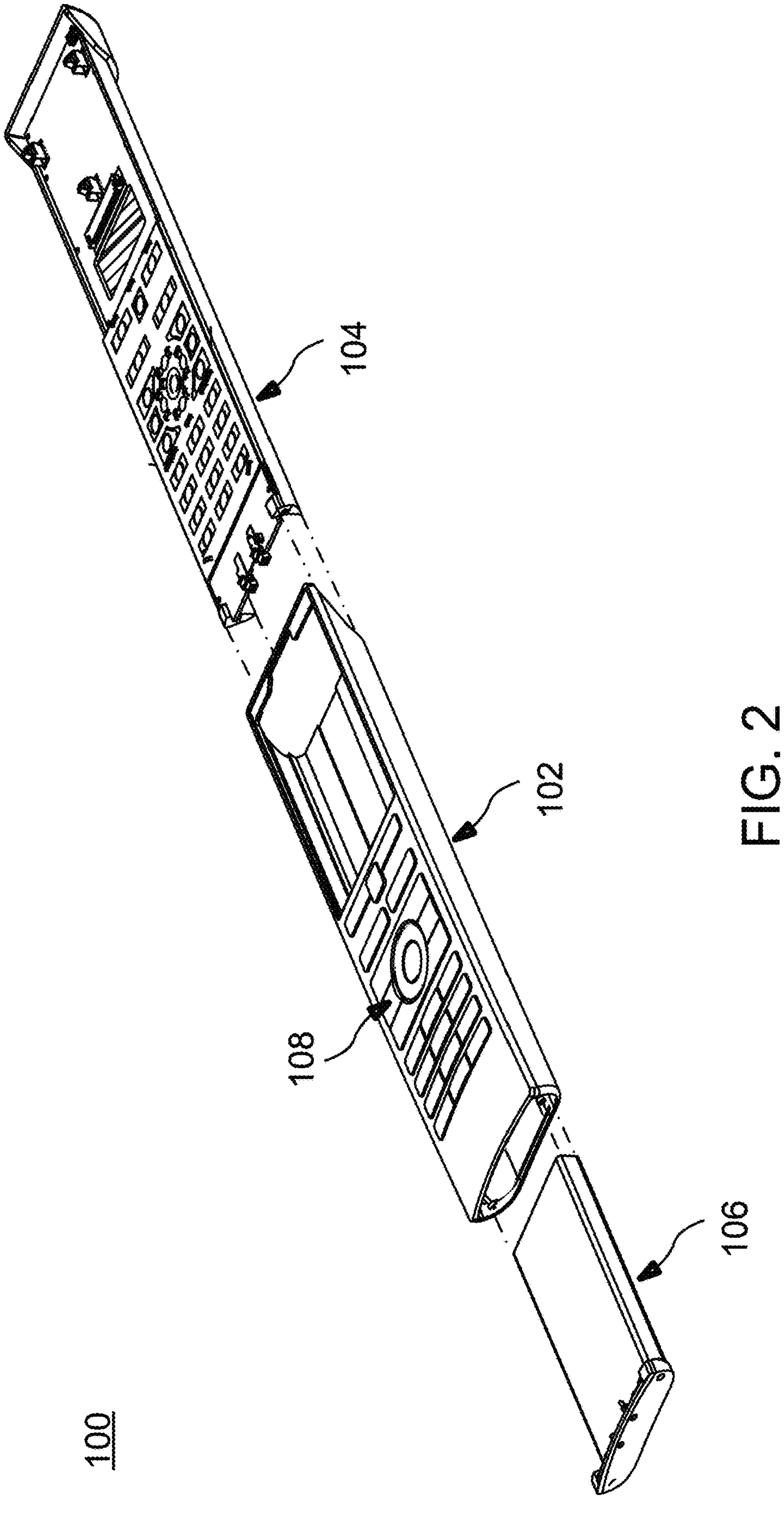

FIG. 2 is an exploded perspective view of the remote control of FIG. 1.

Figure 3A:
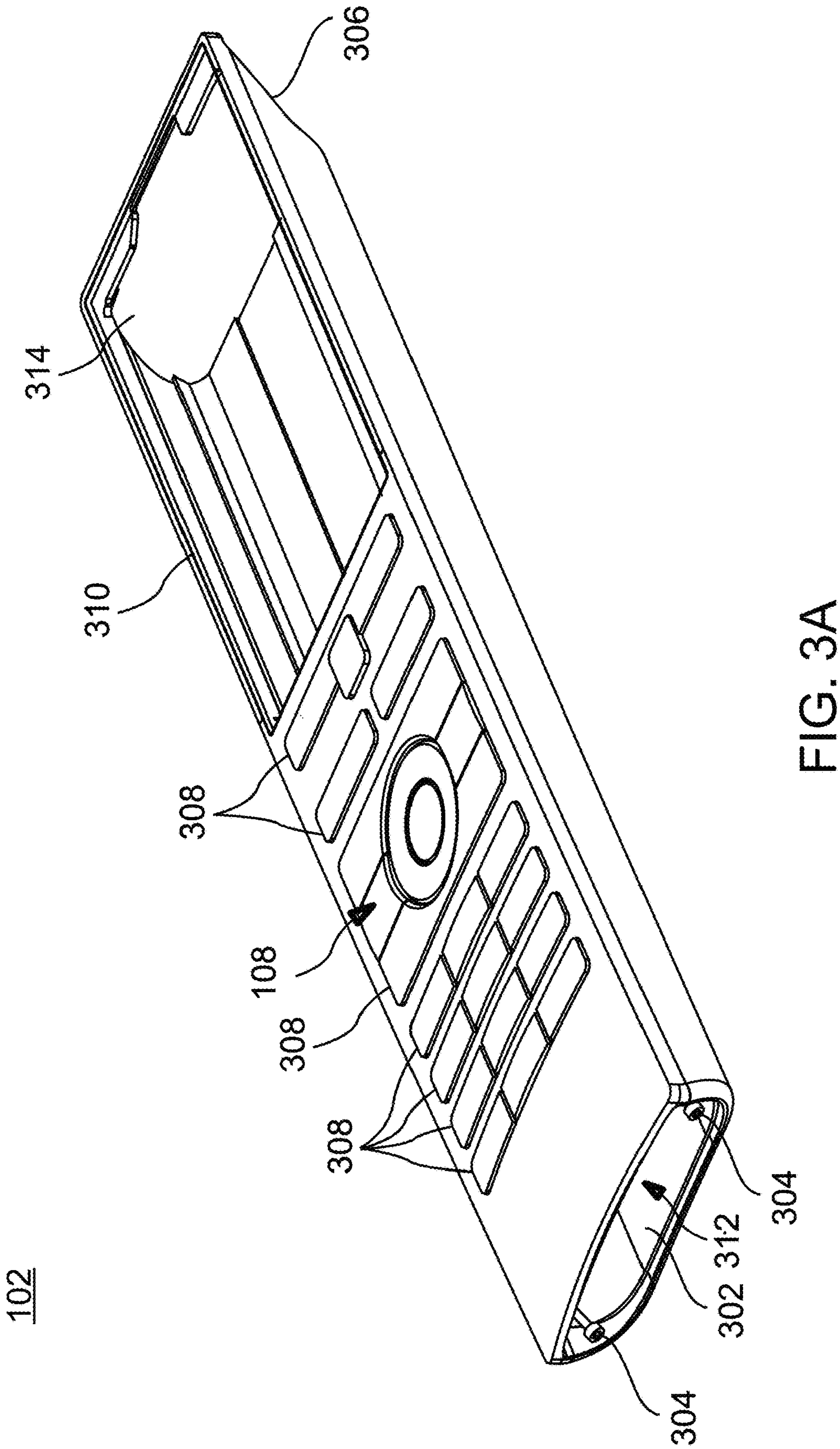

FIG. 3A is a top perspective view of the one-piece casing shown in FIG. 2.

Figure 3B:
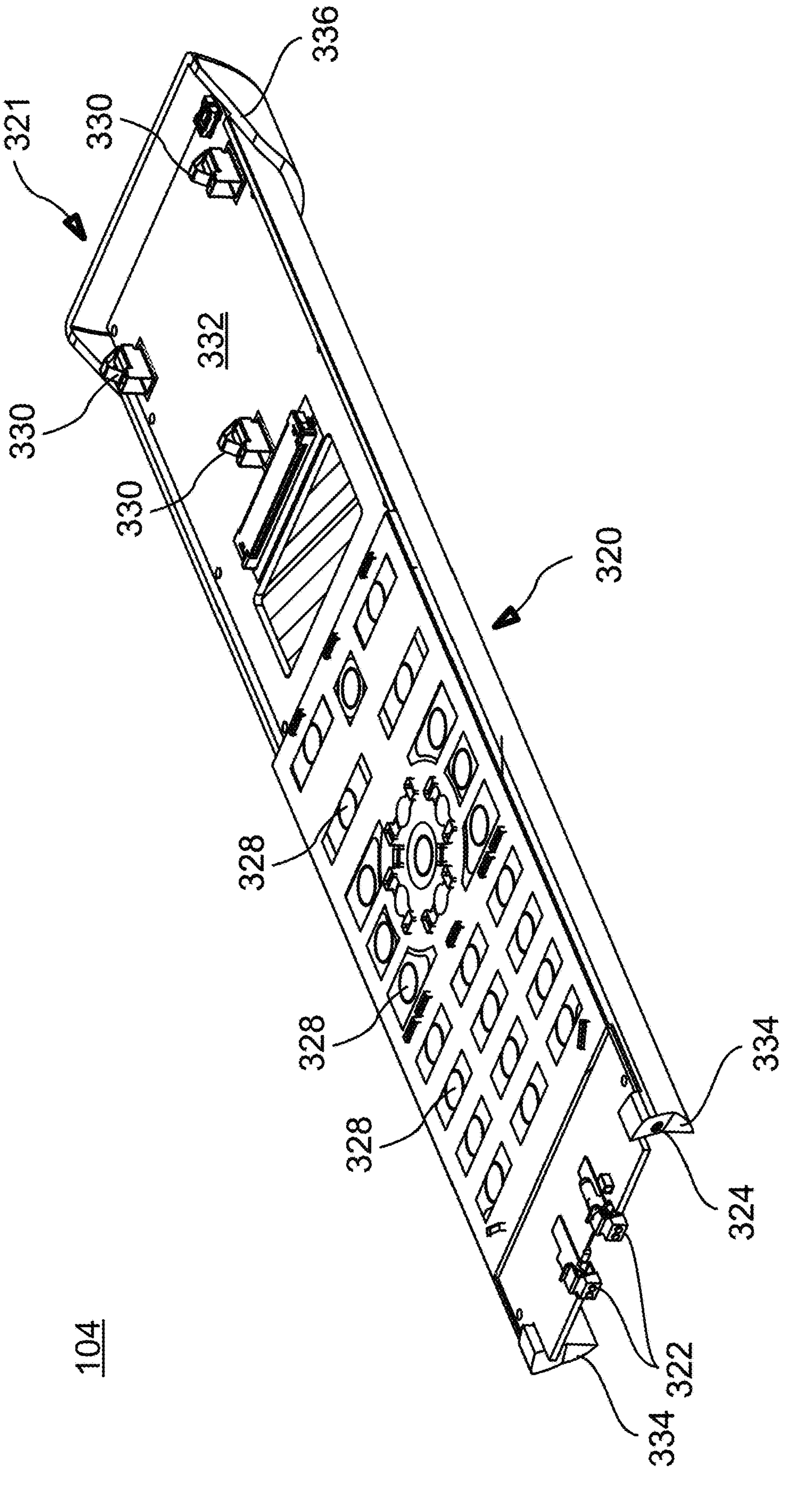

FIG. 3B is a top perspective view of the chassis shown in FIG. 2.

Figure 3C:
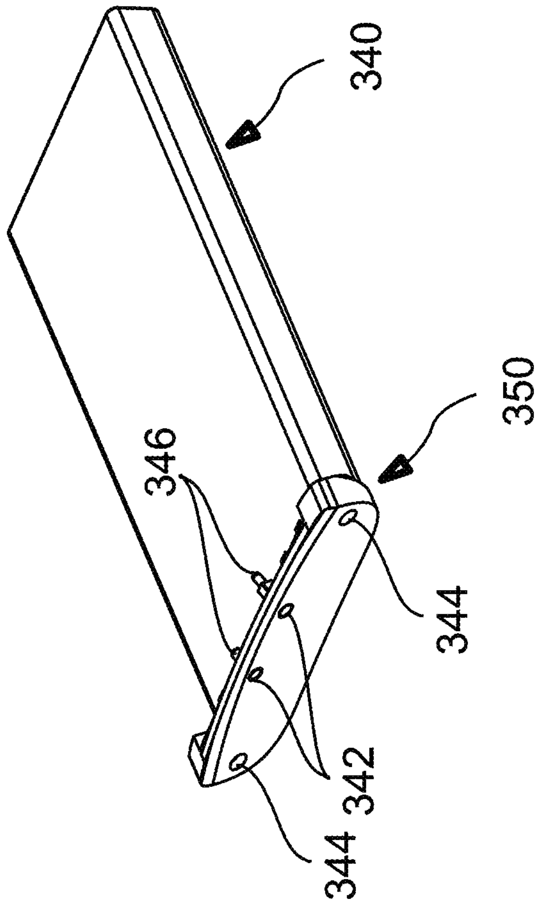

FIG. 3C is a top perspective view of the end-piece shown in FIG. 2.

Figure 4:
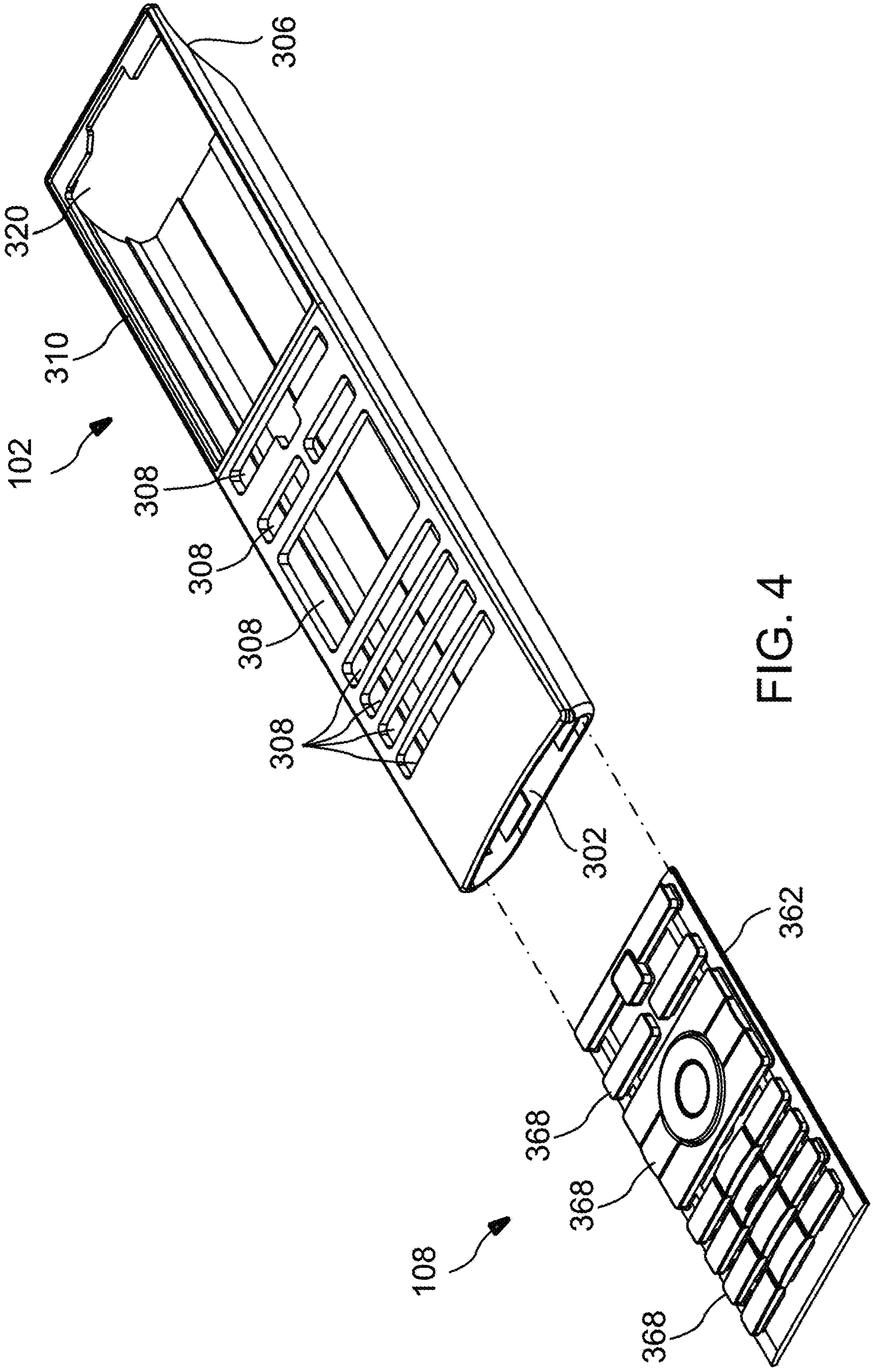

FIG. 4 is a further exploded perspective view of the one-piece casing and keypad shown in FIG. 3.

Figure 5:
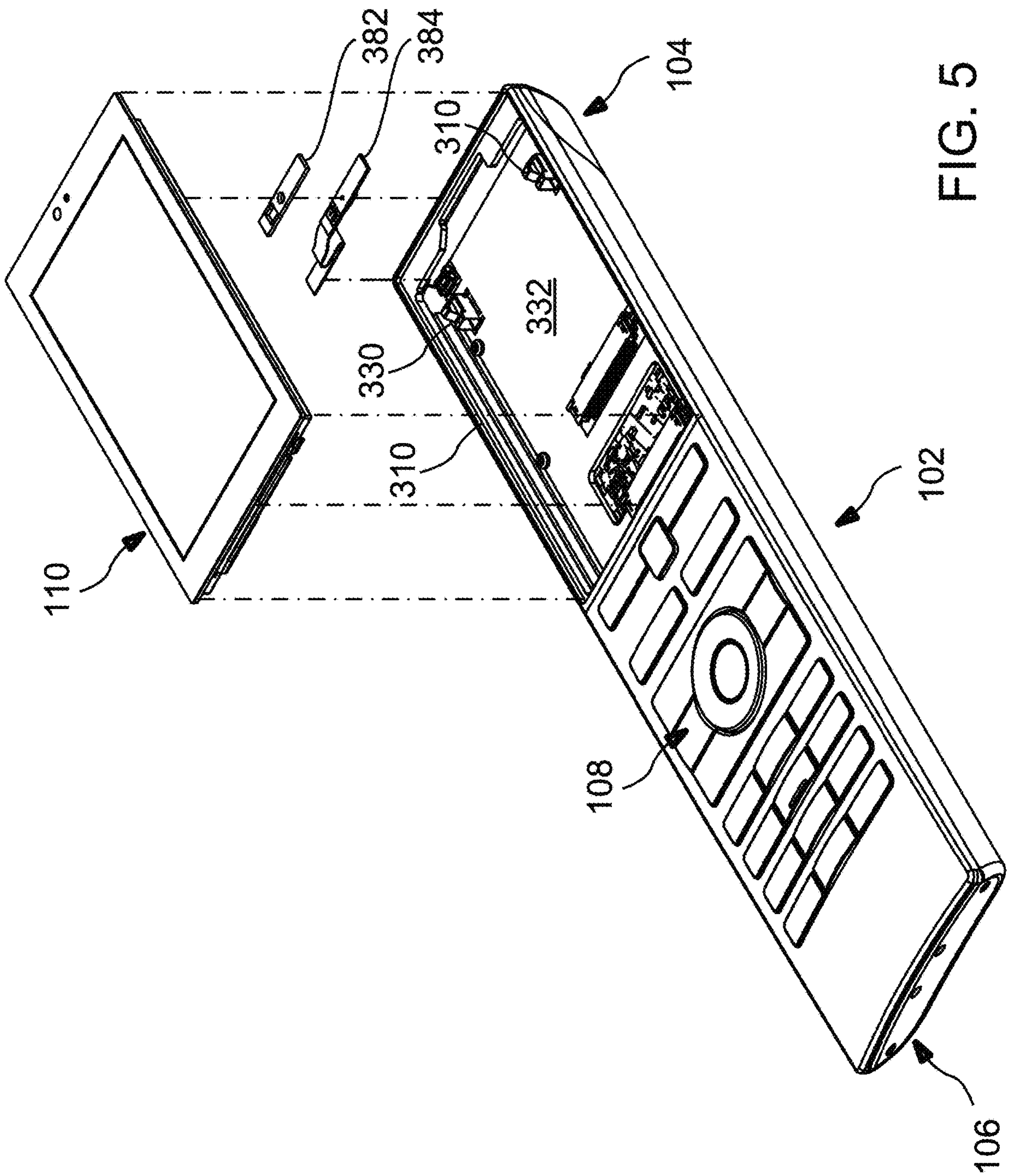

FIG. 5 is a further exploded perspective view of the remote control and display shown in FIG. 1.

Figure 6:
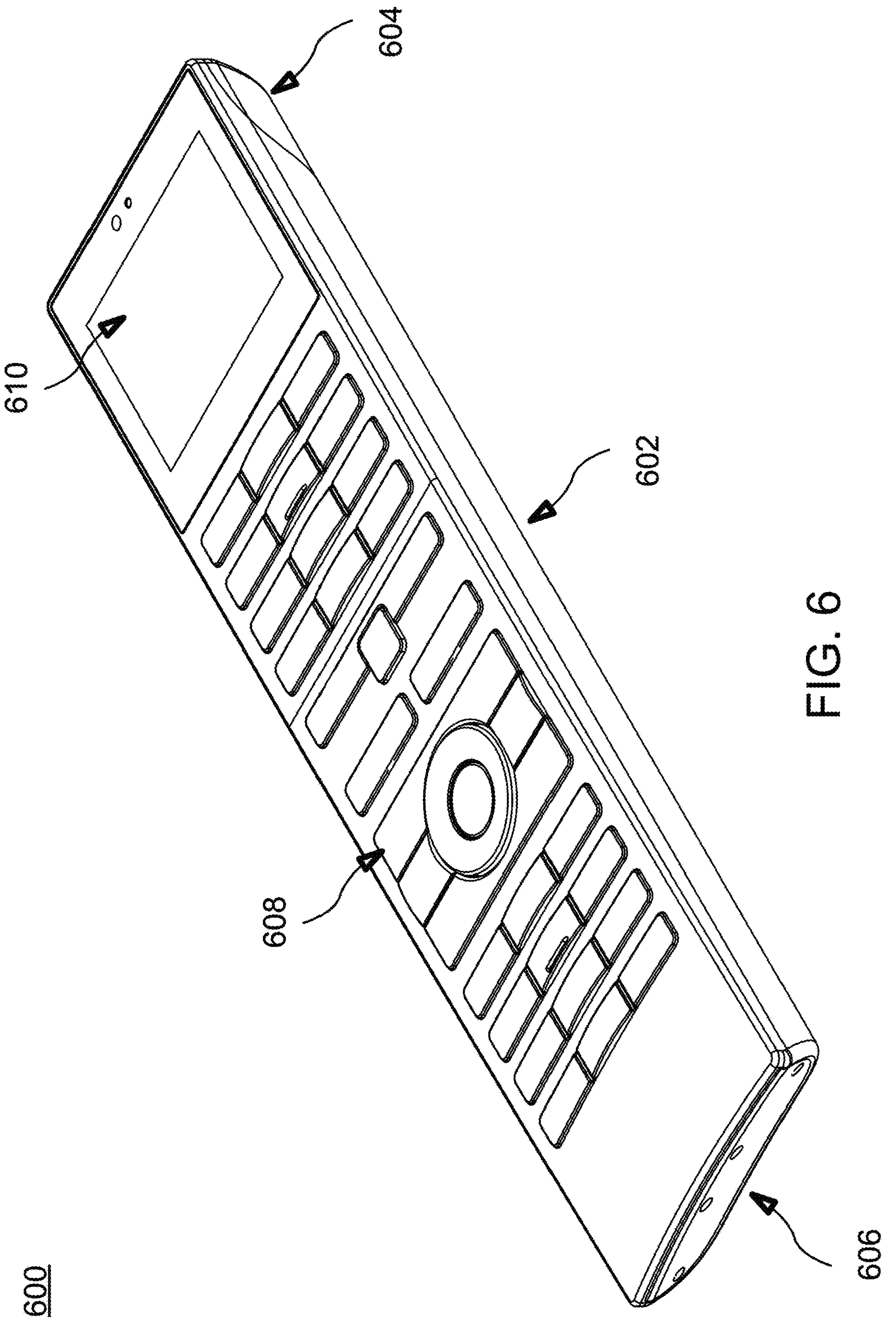

FIG. 6 is a top perspective view of a remote control in accordance with another embodiment.

Figure 7:
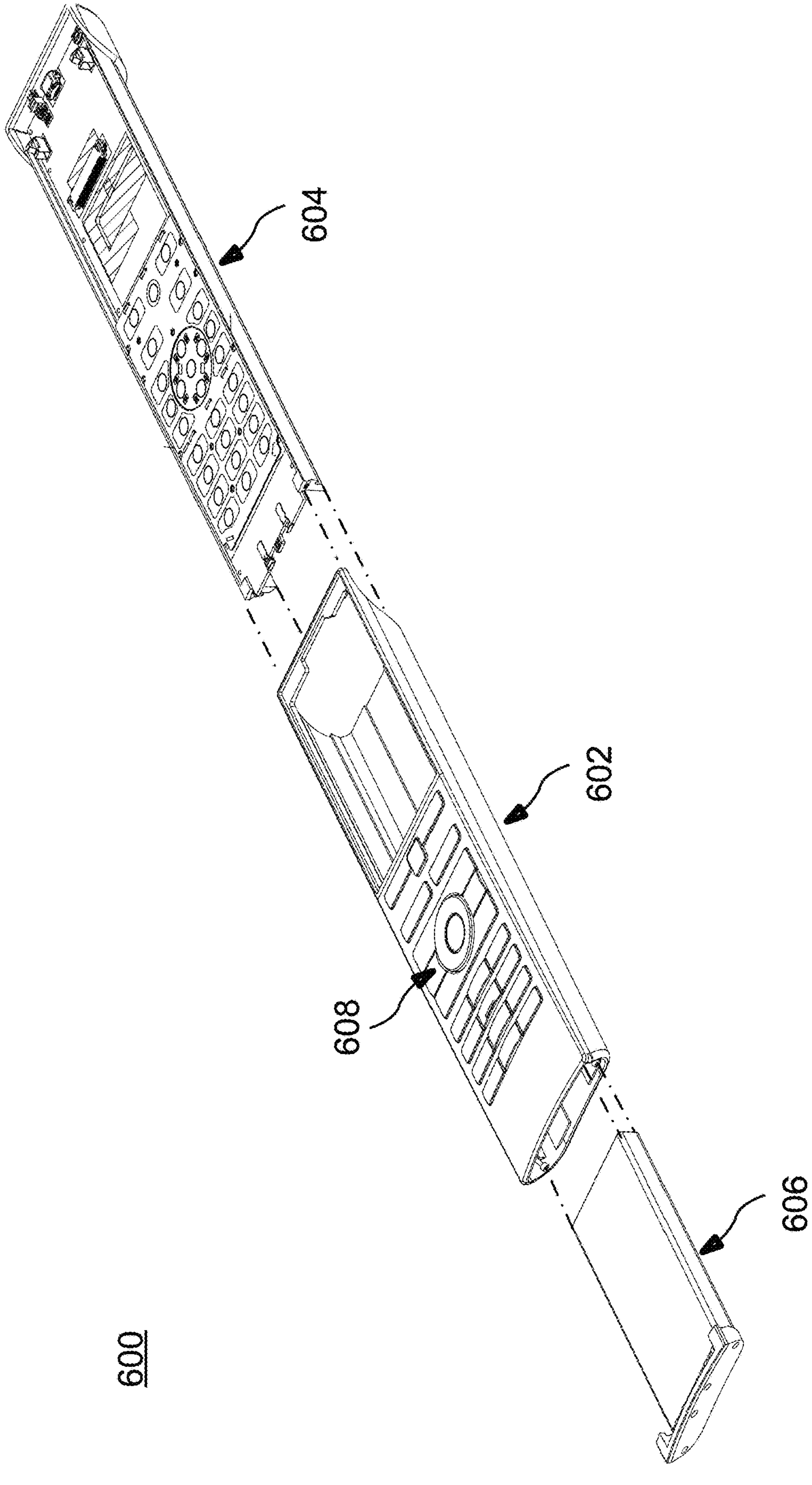

FIG. 7 is an exploded perspective view of the remote control of FIG. 6.

Figure 8A:
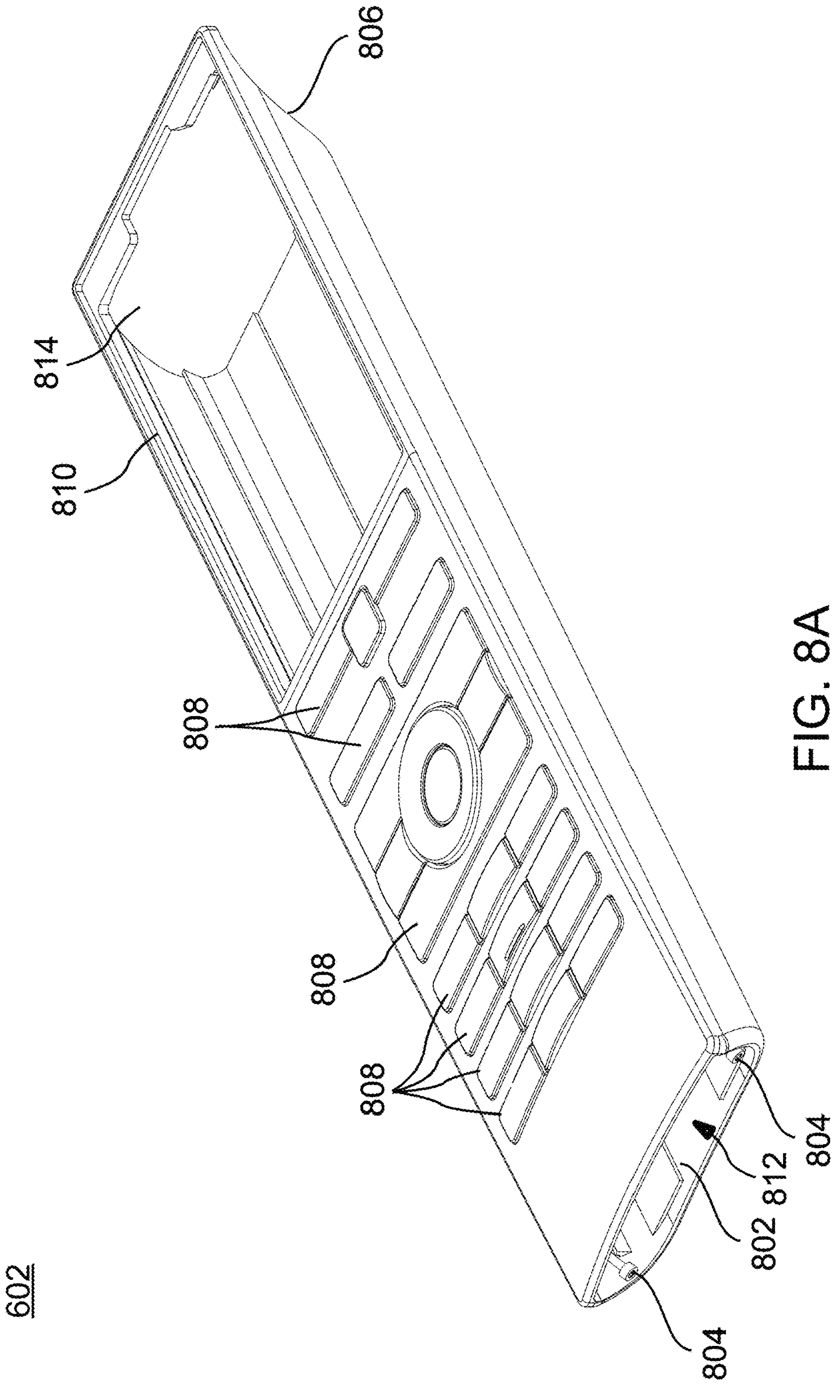

FIG. 8A is a top perspective view of the one-piece casing shown in FIG. 7.

Figure 8B:
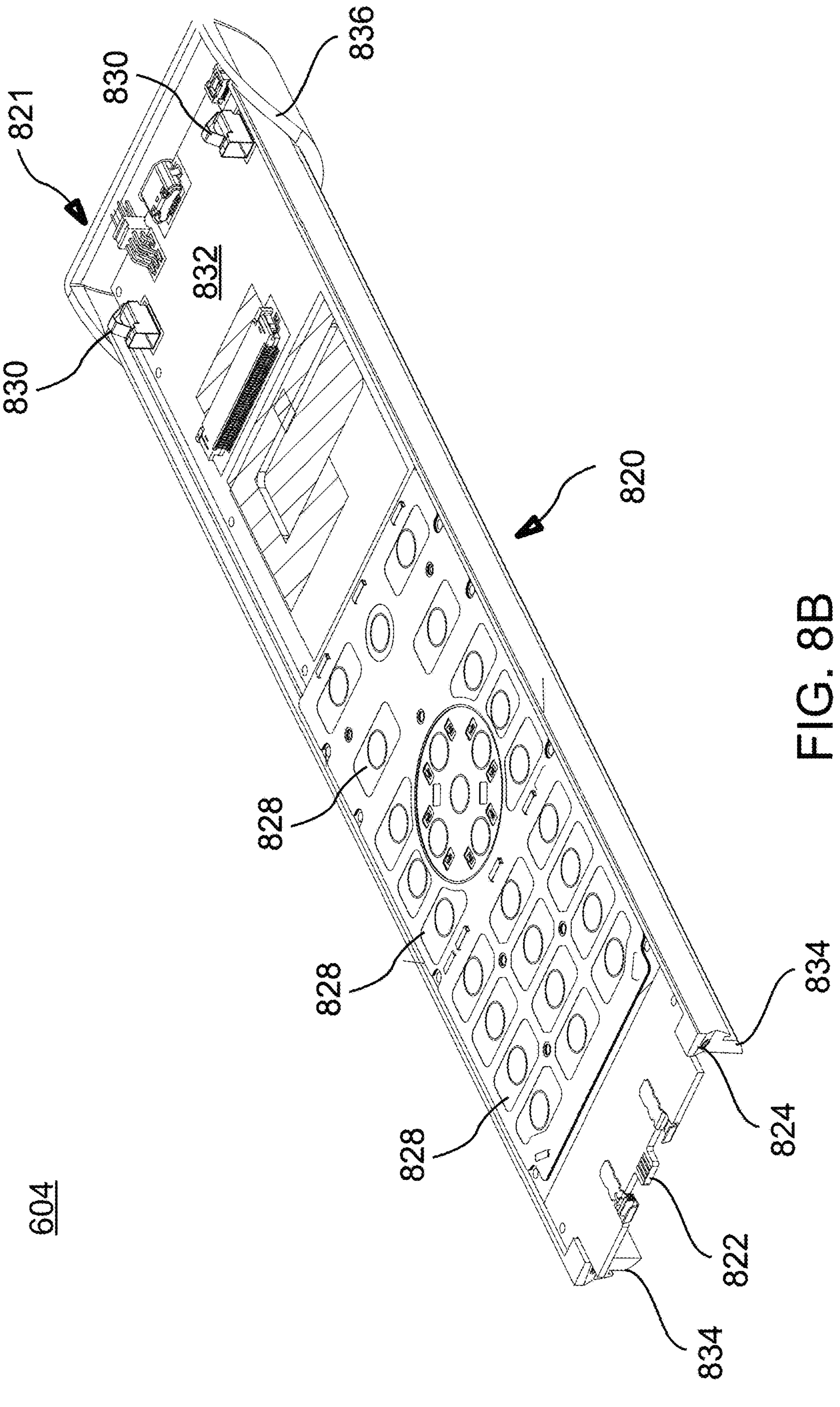

FIG. 8B is a top perspective view of the chassis shown in FIG. 7.

Figure 8C:
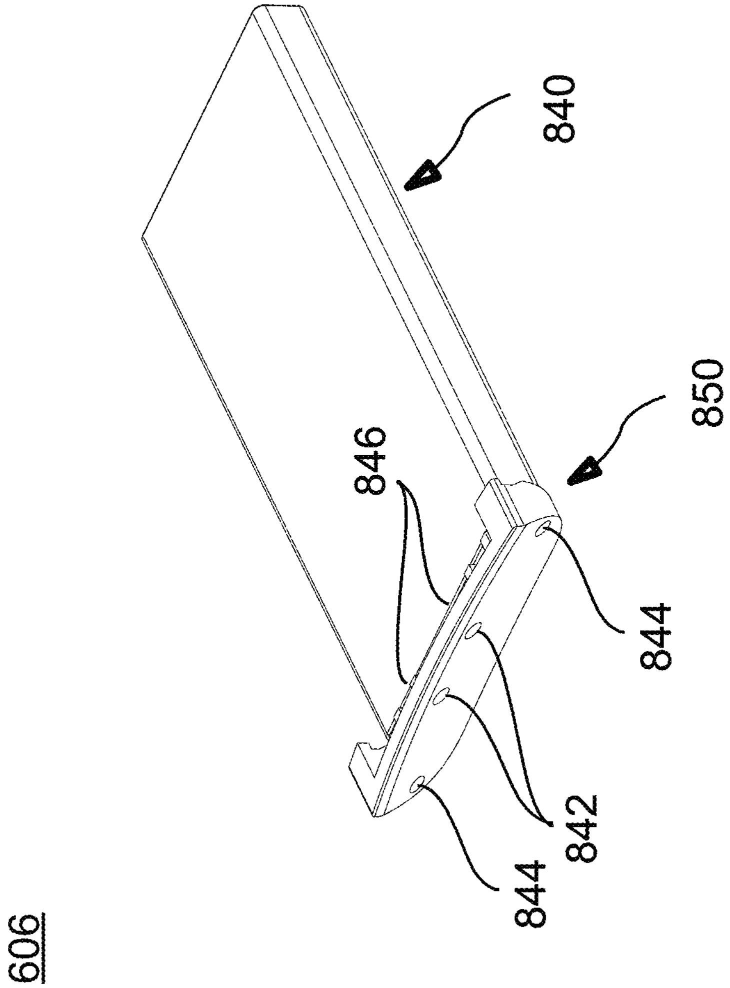

FIG. 8C is a top perspective view of the end-piece shown in FIG. 7.

Figure 9:
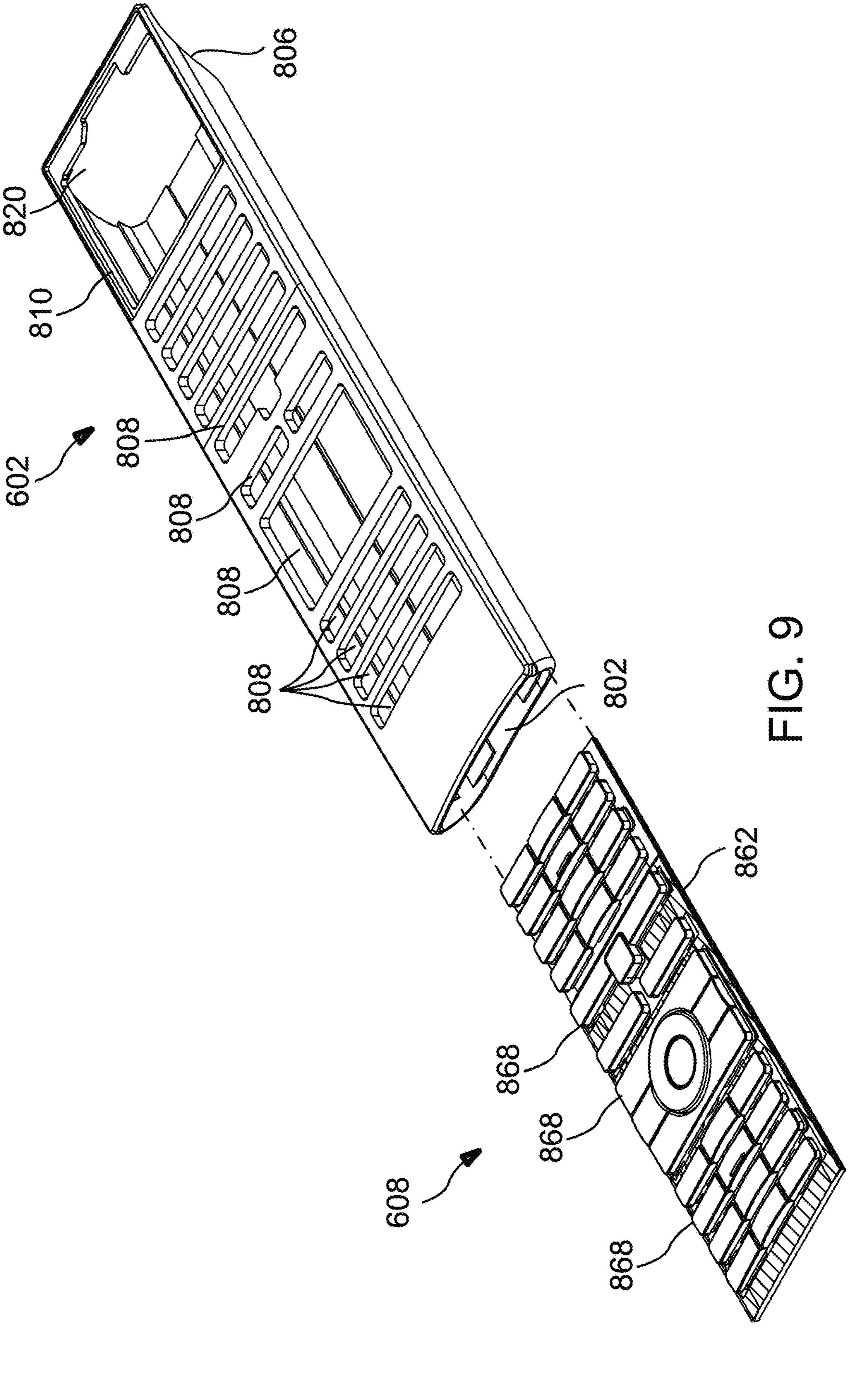

FIG. 9 is a further exploded perspective view of the one-piece casing and keypad shown in FIG. 8.

Figure 10:
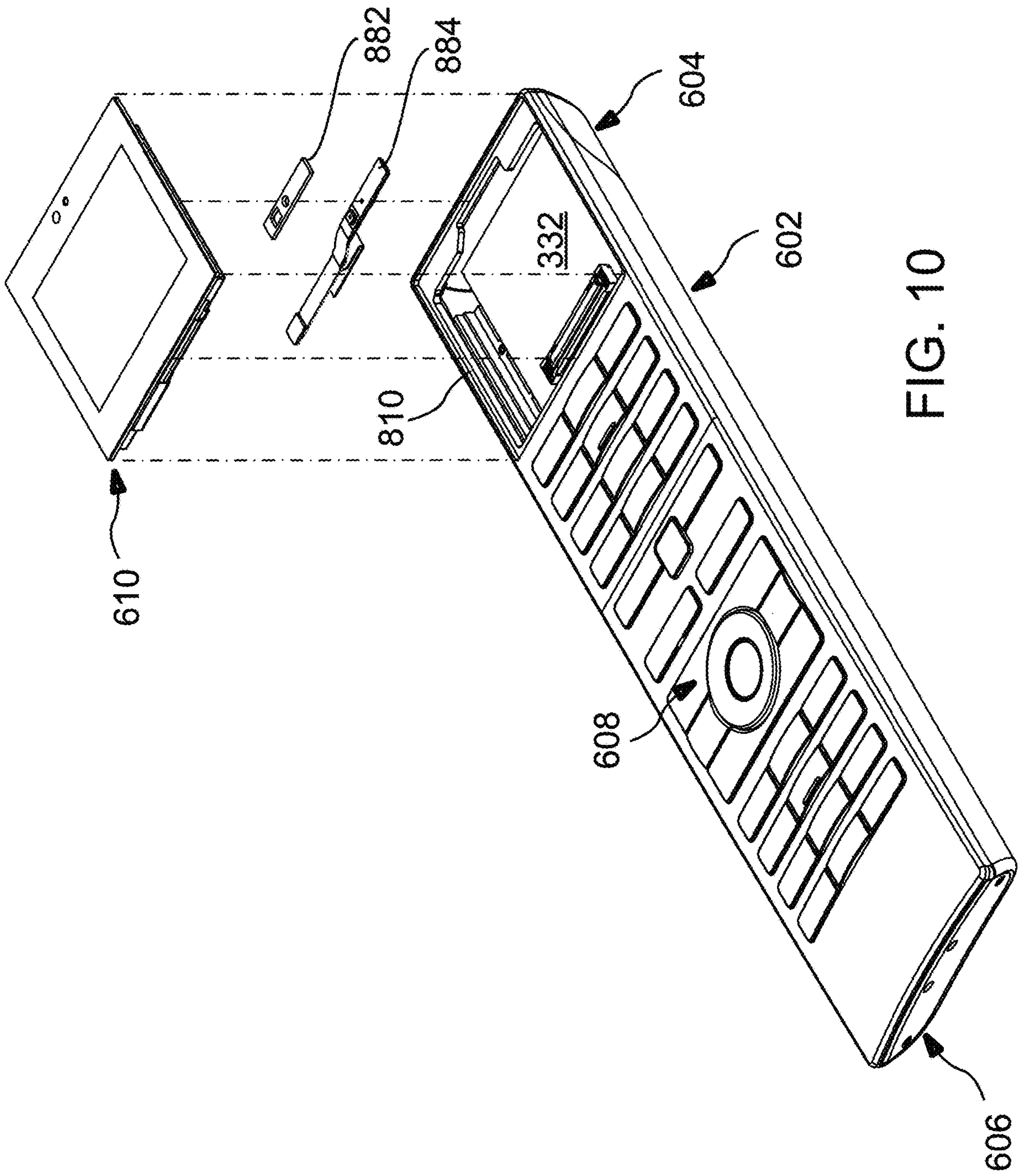

FIG. 10 is a further exploded perspective view of the remote control and display shown in FIG. 6.

DETAILED DESCRIPTION OF THE INVENTION

The present embodiments provide a remote control formed of a one-piece casing having a chassis inserted therein.

Unless the context clearly requires otherwise, throughout the description and the claims, the words 'comprise,' 'comprising,' and the like are to be construed in an inclusive sense as opposed to an exclusive or exhaustive sense; that is to say, in the sense of "including, but not limited to."

LIST OF REFERENCE NUMBERS FOR THE MAJOR ELEMENTS IN THE DRAWING

The following is a list of the major elements in the drawings in numerical order.

100 Remote Control Device
102 One-Piece Casing
104 Chassis
106 End Insert
108 Keypad
110 Display/Touchscreen
302 Opening
304 Bosses
306 Curved Edge
308 Key Openings
310 Display/Touchscreen Opening
312 Inner Cavity
314 Opening
320 Chassis Body
321 Chassis End Part
322 Electrical Contacts
324 Threaded Holes
328 Key Contacts
330 Mounting Clamps
332 Chassis Surface
334 Chassis Legs
336 Curved Edge
340 End Insert Body
342 Docking Station Contacts
344 Screw Holes
346 Contacts
350 End Part
362 Keypad base
368 Keys
382 Spring Contact
384 Spring Contact
600 Remote Control Device
602 One-Piece Casing
604 Chassis
606 End Insert
608 Keypad
610 Display/Touchscreen
802 Opening
804 Bosses
806 Curved Edge
808 Key Openings
810 Display/Touchscreen Opening
812 Inner Cavity
814 Opening
820 Chassis Body
821 Chassis End Part
822 Electrical Contacts
824 Threaded Holes
828 Key Contacts
830 Mounting Clamps
832 Chassis Surface
834 Chassis Legs
836 Curved Edge
840 End Insert Body
842 Docking Station Contacts
844 Screw Holes
846 Contacts
850 End Part
862 Keypad base

868 Keys
882 Spring Contact
884 Spring Contact

MODE(S) FOR CARRYING OUT THE INVENTION

The embodiment described herein in the context of a remote control, but is not limited thereto, except as may be set forth expressly in the appended claims.

Referring first to FIG. 1, a remote control device 100 is shown according to an embodiment. The remote control device 100 includes a one-piece casing 102. Disposed within the one-piece casing 102 are a chassis 104, an end insert 106, a keypad 108 and a display or touchscreen 110.

FIG. 2 is an exploded, perspective view of the remote control device 100 shown in FIG. 1. The one-piece casing 102 is a hollow, one-piece housing and is typically formed of a single piece of metal or plastic. The chassis 104 is insertable into the one-piece casing 102 at one end thereof, and the end insert 106 is insertable into the one-piece casing 102 at another, opposing end.

FIG. 3A is a close-up view of the one-piece casing 102 shown in FIGS. 1 and 2. An opening 314 is located at the one end of the one-piece casing 102 and opens into an inner cavity 312 within the hollow one-piece casing 102. The opening 314 is configured to receive the chassis 104 shown in FIG. 2. A curved edge 306 is located at the one end of the one-piece casing 102 and has a shape that is complementary to a shape of a corresponding edge of the chassis 104.

Another opening 302 is disposed at the opposing end of the one-piece casing 102 and also opens into the inner cavity 312. The opening 302 is configured to receive the end insert 106 shown in FIG. 2.

A pair of bosses 304 are located inside the opening 302 and are configured to receive threaded bolts or screws inserted into corresponding openings in the end insert 106 and in the chassis 104.

A plurality of various shaped key openings 308 are formed in a front surface of the one-piece casing 102 and are configured to receive the keys of the keypad 108.

A touchscreen opening 310 is also formed in the front surface of the one-piece casing 102 and is configured to receive the touchscreen 110.

FIG. 3B shows a close-up view of the chassis 104. The chassis 104 includes a chassis body 320 and an end part 321.

A pair of threaded openings 324 are located at one end of the chassis body 320 and are configured to receive threaded bolts or screws that are inserted into corresponding openings in the end insert 106 and into the bosses 304 of the one-piece casing 102. The screws are then turned to secure the chassis 104 and the end insert 106 to the one-piece casing 102. A pair of electrical contacts 322 are also located at this end of the chassis body 320.

A plurality of key contacts 328 are located on the chassis body 320 and connect to circuitry (not shown) located within the chassis body 320. The circuitry is located beneath the key contacts 328 and may also be located beneath the chassis surface 332 of the chassis body 320. Each key contact 328 is disposed at a location over which a corresponding key of the keypad 108 is disposed when the chassis body 320 is inserted.

A plurality of mounting clamps 330 are disposed on a surface 332 of the chassis body 320. The mounting clamps 330 are configured to receive and hold the touchscreen 110.

A pair of legs 334 extend below from the bottom of the chassis body 320 and support the chassis 104. The legs 334 are located at each side of the chassis body 320 may run the length of the chassis body 320. The outer surface of the legs 334 are shaped to conform to the shape of the sidewalls of the inner cavity 312 of the one-piece casing 102 and may contact the side walls of the inner cavity 312. When the chassis body 320 is inserted into the inner cavity 312 of the one-piece casing 102, the legs 334 cause the chassis body 320 to fit snugly against the side walls and bottom of the inner cavity 312 and hold the chassis body 320 in place within the inner cavity 312.

The end part 321 of the chassis 104 is located at an opposing end of the chassis 104 and is configured to remain outside of the one-piece casing 102 when the chassis body 320 is inserted into the inner cavity 312 of the one-piece casing 102. On each side of the end part 321, a curved edge 336 is formed. The curved edge 336 of the end part 321 and the curved edge 306 of the one-piece casing 102 have mutually complementary curvatures. That is, when the body 320 of the chassis 104 is inserted into the inner cavity 312 of the one-piece casing 102, the curved edge 306 of the casing 102 and the curved edge 336 of the end part 321 may abut closely against each other.

FIG. 3C shows a close-up view of the end insert 106. The end insert 106 includes a body 340, which may house a battery for the remote control device 100, and an end part 350.

A pair of screw holes 344 extend through the end part 350 and are aligned with the bosses 304 of the one-piece casing 102 and with the threaded holes 324 in the chassis body 320. That is, each screw hole 344, the boss 304 aligned to that screw hole 344, and the threaded hole 324 aligned to that boss 304, each receive a threaded screw or bolt (not shown) which, when tightened, helps secure the end part 350 of the end insert 106 to the chassis body 320 as well as helps secure the end part 350 against the one-piece casing 102. The tightening of the screws in this manner also cause the curved edge 306 of the one-piece casing 102 to press against the curved edge 336 of the end part 321 of the chassis 104. In this manner, the screws inserted into the openings 344 in the end part 350 hold the entire remote control device 100 together when the screws are tightened.

A pair of contacts 342 are also located on an outer side of the end part 350 and are electrically connected to contacts 346 located on an inner side of the end part 350. The contacts 342 are configured to receive the electrical contacts of a docking station (not shown) when an end of the remote control device 100 rests in the docking station. In this manner, power may be provided to the remote control device 100 and may be provided to recharge the battery.

FIG. 4 is further exploded perspective view showing the one-piece casing 102 separate from the keypad 108. The keypad 108 includes a keypad base 362 upon which are disposed a plurality of various shaped keys 368.

The keypad 108 is insertable through the opening 302 of the one-piece casing 102 and into the inner cavity 312. The plurality of key openings 308 formed in the front surface of the one-piece casing 102 are configured to receive the keys 368 so that when the keypad 108 is inserted into the inner cavity 312 and then raised up, the keys 368 extend into and through the corresponding the key openings 308.

FIG. 5 shows another exploded perspective view of the remote control device 100 that shows the insertion of a display or touchscreen 110 within an opening 310 in the one-piece casing 102.

The display or touchscreen 110 is inserted into the opening 310 of the one-piece casing 102 after the chassis body 320 and the end insert body 340 are inserted into the inner cavity 312 of the one-piece casing 102 and secured together. A plurality of mounting clamps 330 are located on the chassis surface 332, and when the display or touchscreen 110 is inserted into the opening 310, the mounting clamps 330 mate with corresponding structures in the display or touchscreen 110 and secure the display or touchscreen 110 to the chassis 104.

Two or more spring contacts 382, 384 are located between the display or touchscreen 110 and the chassis surface 314 and provide an electrical connection between the display or touchscreen 110 and the circuitry within the chassis body 320.

To assemble the remote control device 100, the keypad 108 is first inserted into the opening 302 of the one-piece casing 102, as shown in FIG. 4, and then the keypad 108 is raised up within the inner cavity 312 of the one-piece casing 102 such that each key 368 of the keypad 108 extends through a corresponding one of the key openings 308 in the front surface of the one-piece casing 102.

Next, the chassis body 320 is inserted into the opening 314 of the one-piece casing 102, as shown in FIG. 2, and the chassis body 314 is translated within the inner cavity 312 of the one-piece casing 102 until the curved edge 336 of the end part 321 of the chassis 104 abuts against the curved edge 306 of the one-piece casing 102.

Also, the body 340 of the end insert 106 is inserted into the opening 302 of the one-piece casing 102 until the end part 350 either fits inside or abuts against the one-piece casing 102. The body 340 of the end insert 106 may also rest underneath part of the chassis body 320 between the pair of legs 334.

Then, the threaded screws or bolts are inserted into the openings 344 in the end part 350 and through the bosses 304 into the threaded holes 324. Then, the threaded screws or bolts are turned until the end insert 106 and the chassis 104 are each secured to the one-piece casing 102.

Thereafter, the display or touchscreen 110 is inserted into the opening 310 of the one-piece casing 102 and secured by the mounting clamps 330 to hold the display or touchscreen 110. In this manner, assembly of the remote control device 100 is completed.

FIG. 6 shows a remote control device 600 according to another embodiment in which additional keys are provided in place of a portion of the display or touchscreen of the remote control device 100.

The remote control device 600 includes a one-piece casing 602. Disposed within the one-piece casing 602 are a chassis 604, an end insert 606, a keypad 608 and a display or touchscreen 610.

FIG. 7 is an exploded, perspective view of the remote control device 600 shown in FIG. 6. The one-piece casing 602 is a hollow, one-piece housing and is typically formed of a single piece of metal or plastic. The chassis 604 is insertable into the one-piece casing 602 at one end thereof, and the end insert 606 is insertable into the one-piece casing 602 at another, opposing end.

FIG. 8A is a close-up view of the one-piece casing 602 shown in FIGS. 6 and 7. An opening 814 is located at the one end of the one-piece casing 602 and opens into an inner cavity 812 within the hollow one-piece casing 602. The opening 814 is configured to receive the chassis 604 shown in FIG. 7. A curved edge 806 is located at the one end of the one-piece casing 602 and has a shape that is complementary to a shape of a corresponding edge of the chassis 604.

Another opening 802 is disposed at the opposing end of the one-piece casing 602 and also opens into the inner cavity 812. The opening 802 is configured to receive the end insert 606 shown in FIG. 7.

A pair of bosses 804 are located inside the opening 802 and are configured to receive threaded bolts or screws inserted into corresponding openings in the end insert 606 and in the chassis 604.

A plurality of various shaped key openings 808 are formed in a front surface of the one-piece casing 602 and are configured to receive the keys of the keypad 608.

A touchscreen opening 810 is also formed in the front surface of the one-piece casing 602 and is configured to receive the touchscreen 610.

FIG. 8B shows a close-up view of the chassis 604. The chassis 604 includes a chassis body 820 and an end part 821.

A pair of threaded openings 824 are located at one end of the chassis body 820 and are configured to receive threaded bolts or screws that are inserted into corresponding openings in the end insert 606 and into the bosses 804 of the one-piece casing 602. The screws are then turned to secure the chassis 604 and the end insert 606 to the one-piece casing 602. A pair of electrical contacts 822 are also located at this end of the chassis body 820.

A plurality of key contacts 828 are located on the chassis body 820 and connect to circuitry (not shown) located within the chassis body 820. The circuitry is located beneath the key contacts 828 and may also be located beneath the chassis surface 832 of the chassis body 820. Each key contact 828 is disposed at a location over which a corresponding key of the keypad 608 is disposed when the chassis body 820 is inserted.

A plurality of mounting clamps 830 are disposed on a surface 832 of the chassis body 820. The mounting clamps 830 are configured to receive and hold the touchscreen 610.

A pair of legs 834 extend below from the bottom of the chassis body 820 and support the chassis 604. The legs 834 are located at each side of the chassis body 820 may run the length of the chassis body 820. The outer surface of the legs 834 are shaped to conform to the shape of the sidewalls of the inner cavity 812 of the one-piece casing 602 and may contact the side walls of the inner cavity 812. When the chassis body 820 is inserted into the inner cavity 812 of the one-piece casing 602, the legs 834 cause the chassis body 820 to fit snugly against the side walls and bottom of the inner cavity 812 and hold the chassis body 820 in place within the inner cavity 812.

The end part 821 of the chassis 604 is located at an opposing end of the chassis 604 and is configured to remain outside of the one-piece casing 602 when the chassis body 820 is inserted into the inner cavity 812 of the one-piece casing 602. On each side of the end part 821, a curved edge 836 is formed. The curved edge 836 of the end part 821 and the curved edge 806 of the one-piece casing 602 have mutually complementary curvatures. That is, when the body 820 of the chassis 604 is inserted into the inner cavity 812 of the one-piece casing 602, the curved edge 806 of the casing 602 and the curved edge 836 of the end part 821 may abut closely against each other.

FIG. 8C shows a close-up view of the end insert 606. The end insert 606 includes a body 840, which may house a battery for the remote control device 600, and an end part 850.

A pair of screw holes 844 extend through the end part 850 and are aligned with the bosses 804 of the one-piece casing 602 and with the threaded holes 824 in the chassis body 820. That is, each screw hole 844, the boss 804 aligned to that screw hole 844, and the threaded hole 824 aligned to that boss 804, each receive a threaded screw or bolt (not shown) which, when tightened, helps secure the end part 850 of the end insert 606 to the chassis body 820 as well as helps secure the end part 850 against the one-piece casing 602. The tightening of the screws in this manner also cause the curved edge 806 of the one-piece casing 602 to press against the curved edge 836 of the end part 821 of the chassis 604. In this manner, the screws inserted into the openings 844 in the end part 850 hold the entire remote control device 600 together when the screws are tightened.

A pair of contacts 842 are also located on an outer side of the end part 850 and are electrically connected to contacts 846 located on an inner side of the end part 850. The contacts 842 are configured to receive the electrical contacts of a docking station (not shown) when an end of the remote control device 600 rests in the docking station. In this manner, power may be provided to the remote control device 600 and may be provided to recharge the battery.

FIG. 9 is further exploded perspective view showing the one-piece casing 602 separate from the keypad 608. The keypad 608 includes a keypad base 862 upon which are disposed a plurality of various shaped keys 868.

The keypad 608 is insertable through the opening 802 of the one-piece casing 602 and into the inner cavity 812. The plurality of key openings 808 formed in the front surface of the one-piece casing 602 are configured to receive the keys 868 so that when the keypad 608 is inserted into the inner cavity 812 and then raised up, the keys 868 extend into and through the corresponding the key openings 808.

FIG. 60 shows another exploded perspective view of the remote control device 600 that shows the insertion of a display or touchscreen 610 within an opening 810 in the one-piece casing 602.

The display or touchscreen 610 is inserted into the opening 810 of the one-piece casing 602 after the chassis body 820 and the end insert body 840 are inserted into the inner cavity 812 of the one-piece casing 602 and secured together. A plurality of mounting clamps 830 are located on the chassis surface 832, and when the display or touchscreen 610 is inserted into the opening 810, the mounting clamps 830 mate with corresponding structures in the display or touchscreen 610 and secure the display or touchscreen 610 to the chassis 604.

Two or more spring contacts 882, 884 are located between the display or touchscreen 610 and the chassis surface 814 and provide an electrical connection between the display or touchscreen 610 and the circuitry within the chassis body 820.

To assemble the remote control device 600, the keypad 608 is first inserted into the opening 802 of the one-piece casing 602, as shown in FIG. 9, and then the keypad 608 is raised up within the inner cavity 812 of the one-piece casing 602 such that each key 868 of the keypad 608 extends through a corresponding one of the key openings 808 in the front surface of the one-piece casing 602.

Next, the chassis body 820 is inserted into the opening 814 of the one-piece casing 602, as shown in FIG. 7, and the chassis body 814 is translated within the inner cavity 812 of the one-piece casing 602 until the curved edge 836 of the end part 821 of the chassis 604 abuts against the curved edge 806 of the one-piece casing 602.

Also, the body 840 of the end insert 606 is inserted into the opening 802 of the one-piece casing 602 until the end part 850 either fits inside or abuts against the one-piece casing 602. The body 840 of the end insert 606 may also rest underneath part of the chassis body 820 between the pair of legs 834.

Then, the threaded screws or bolts are inserted into the openings 844 in the end part 850 and through the bosses 804 into the threaded holes 824. Then, the threaded screws or bolts are turned until the end insert 606 and the chassis 604 are each secured to the one-piece casing 602.

Thereafter, the display or touchscreen 610 is inserted into the opening 810 of the one-piece casing 602 and secured by the mounting clamps 830 to hold the display or touchscreen 610. In this manner, assembly of the remote control device 600 is completed.

In this manner, each of the remote controls 100 and 600 of the embodiments provides an arrangement of parts that are easier to assemble and simpler to service.

INDUSTRIAL APPLICABILITY

To solve the aforementioned problems, the present embodiments provide a remote control with a one-piece casing and chassis.

It should be understood that this description is not intended to limit the embodiments. On the contrary, the embodiments are intended to cover alternatives, modifications, and equivalents, which are included in the spirit and scope of the embodiments as defined by the appended claims. Further, in the detailed description of the embodiments, numerous specific details are set forth to provide a comprehensive understanding of the claimed embodiments. However, one skilled in the art would understand that various embodiments may be practiced without such specific details.

Although the features and elements of aspects of the embodiments are described as being in particular combinations, each feature or element may be used alone, without the other features and elements of the embodiments, or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

The above-described embodiments are intended to be illustrative in all respects, rather than restrictive, of the embodiments. Thus, the embodiments are capable of many variations in detailed implementation that may be derived from the description contained herein by a person skilled in the art. No element, act, or instruction used in the description of the present application should be construed as critical or essential to the embodiments unless explicitly described as such. Also, as used herein, the article "a" is intended to include one or more items.

In addition, the above disclosed methods are not meant to limit the aspects of the embodiments, or to suggest that the aspects of the embodiments should be implemented following the aforementioned methods. The purpose of the aforementioned methods is to facilitate the understanding of one or more aspects of the embodiments and to provide the reader with one or many possible implementations of the processed discussed herein. It should be understood by one of ordinary skill in the art that the steps of the aforementioned methods may be performed in a different order and that some steps may be eliminated or substituted.

All United States patents and applications, foreign patents, and publications discussed above are hereby incorporated herein by reference in their entireties.

ALTERNATE EMBODIMENTS

Alternate embodiments may be devised without departing from the spirit or the scope of the embodiments.

What is claimed is:

1. A remote control device, comprising:

(a) a single-piece casing having (1) a front surface, a rear surface, and a pair of opposing side surfaces disposed between the front and rear surfaces, (2) an inner cavity formed within the casing between the top, bottom and side surfaces and extending along at least part of a length of the casing, (3) a front opening formed in the front surface and extending into the inner cavity, the front opening being configured to receive a display, and (4) at least one key opening formed in the front surface and extending into the inner cavity:

(b) a keypad configured to be disposed within the inner cavity, the keypad including at least one key, the at least one key being positioned on the keypad to extend through the at least one key opening in the casing;

(c) a chassis having a body configured to be disposed within the inner cavity at least beneath the keypad and the front opening;

(d) a display configured to be inserted into the front opening of the casing; and (e) at least one spring contact configured to electrically connect circuitry disposed within the body of the chassis to the display.

2. The remote control device of claim 1, wherein (a) a plurality of key openings are disposed in the front surface of the casing and extend into the inner cavity, and (b) the keypad includes a plurality of keys arranged on the keypad such that each one of the plurality of keys extends through a corresponding one of the plurality of key openings.

3. The remote control device of claim 2, wherein the body of the chassis includes a plurality of key contacts arranged on the body such that each one of the plurality of keys is associated with a corresponding one of the plurality of key contacts.

4. The remote control device of claim 3, wherein the plurality of key contacts connect to circuitry located within the body of the chassis.

5. The remote control device of claim 1, wherein the body of the chassis includes a pair of legs extending from the body of the chassis, the pair of legs being configured to provide a spacing between the body of the chassis and the casing.

6. The remote control device of claim 5, wherein the pair of legs extend along a length of the body of the chassis.

7. The remote control device of claim 1, wherein the display includes a touchscreen.

8. The remote control device of claim 1, further comprising at least one mounting clamp disposed on a front surface of the body of the chassis and configured to secure the display to the chassis.

9. Remote control device, comprising:

(a) a single-piece casing having (1) a front surface, a rear surface, and a pair of opposing side surfaces disposed between the front and rear surfaces, (2) an inner cavity formed within the casing between the top, bottom and side surfaces and extending between one end of the casing and another end of the casing, the inner cavity forming an end opening at the one end of the casing, (3) a front opening formed in the front surface and extending into the inner cavity, the front opening being configured to receive a display, and (4) at least one key opening formed in the front surface and extending into the inner cavity;

(b) a keypad configured to be disposed within the inner cavity, the keypad including at least one key, the at least one key being positioned on the keypad to extend through the at least one key opening in the casing;

(c) a chassis having a body configured to be disposed within the inner cavity at least beneath the keypad and the front opening, the body being further configured to be inserted into the inner cavity through the end opening such that an end part of the chassis abuts against the one end of the casing;

(d) a display configured to be inserted into the front opening of the casing; and (e) at least one spring contact configured to electrically connect circuitry disposed within the body of the chassis to the display.

10. The remote control device of claim 9, wherein (a) a plurality of key openings are disposed in the front surface of the casing and extend into the inner cavity, and (b) the keypad includes a plurality of keys arranged on the keypad such that each one of the plurality of keys extends through a corresponding one of the plurality of key openings.

11. Remote control device, comprising:

(a) a single-piece casing having (1) a front surface, a rear surface, and a pair of opposing side surfaces disposed between the front and rear surfaces, (2) an inner cavity formed within the casing between the top, bottom and side surfaces and extending between one end of the casing and another end of the casing, the inner cavity forming an end opening at the another end of the casing, (3) a front opening formed in the front surface and extending into the inner cavity, the front opening being configured to receive a display, and (4) at least one key opening formed in the front surface and extending into the inner cavity;

(b) a keypad configured to be disposed within the inner cavity, the keypad including at least one key, the at least one key being positioned on the keypad to extend through the at least one key opening in the casing;

(c) a chassis having a body configured to be disposed within the inner cavity at least beneath the keypad and the front opening;

(d) an end part configured to be disposed at the end opening of the casing;

(e) a display configured to be inserted into the front opening of the casing; and (f) at least one spring contact configured to electrically connect circuitry disposed within the body of the chassis to the display.

12. The remote control device of claim 11, wherein the casing, the chassis and the end part are each configured such that securing the end part to the body of the chassis secures both the chassis and the end part against the casing.

13. The remote control device of claim 11, wherein (a) the body of the chassis includes at least one threaded opening disposed at an end facing the end part, (b) the end part includes at least one opening aligned with the at least one threaded opening of the body of the chassis, and (c) a threaded screw inserted into the at least one opening of the end insert and turned into the at least one threaded opening of the body of the chassis secures the chassis to the end part.

14. The remote control device of claim 11, further comprising an end insert having a body that is attached at one end to the end part, the body being configured to be inserted into the inner cavity though the end opening and disposed within the inner cavity.

15. The remote control device of claim 11, wherein the body of the chassis includes at least one electrical contact disposed at an end facing the end part, the at least one electrical contact being connected to circuitry located within the body of the chassis.

16. The remote control device of claim 15, wherein (a) the end part includes at least one electrical contact located on an inner surface of the end part that is electrically connectable to the at least one electrical contact disposed at the end of the body of the chassis, and (b) the end part includes at least another electrical contact located on an outer surface of the end part that is electrically connected to the at least one electrical contact located the inner surface of the end part.

17. The remote control device of claim 16, wherein the at least another electrical contact located on an outer surface of the end part is configured to be electrically connected to an electrical contact of an external docking station and thereby provide an electrical path between the external docking station and the circuitry located within the body of the chassis.

* * * * *